(12) United States Patent
Chavan et al.

(10) Patent No.: US 11,856,790 B2
(45) Date of Patent: Dec. 26, 2023

(54) FERROELECTRIC CAPACITORS

(71) Applicant: Micron Technology, Inc., Boise, ID (US)

(72) Inventors: Ashonita A. Chavan, Boise, ID (US); Durai Vishak Nirmal Ramaswamy, Boise, ID (US); Manuj Nahar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/072,546

(22) Filed: Nov. 30, 2022

(65) Prior Publication Data

US 2023/0121892 A1 Apr. 20, 2023

Related U.S. Application Data

(60) Division of application No. 16/989,218, filed on Aug. 10, 2020, now Pat. No. 11,552,086, which is a (Continued)

(51) Int. Cl.
*H01L 29/78* (2006.01)
*H10B 53/30* (2023.01)
(Continued)

(52) U.S. Cl.
CPC ....... *H10B 53/30* (2023.02); *H01L 21/02164* (2013.01); *H01L 21/28088* (2013.01);
(Continued)

(58) Field of Classification Search
CPC ... H10B 53/30; H10B 51/30; H01L 27/11507; H01L 21/02164; H01L 21/28088;
(Continued)

(56) References Cited

U.S. PATENT DOCUMENTS 5,444,008 A 8/1995 Han et al.
5,753,934 A 5/1998 Yano et al.
(Continued)

FOREIGN PATENT DOCUMENTS

CN 1165380 11/1997
CN 1358326 7/2002
(Continued)

OTHER PUBLICATIONS

Muller et al., "Ferroelectricity in Simple Binary ZrO2 and HfO2", Nano Letters, 2012, United States, pp. 4318-4323.
(Continued)

*Primary Examiner* — Walter H Swanson
(74) *Attorney, Agent, or Firm* — Wells St. John P.S.

(57) ABSTRACT

A method used in forming an electronic component comprising conductive material and ferroelectric material comprises forming a non-ferroelectric metal oxide-comprising insulator material over a substrate. A composite stack comprising at least two different composition non-ferroelectric metal oxides is formed over the substrate. The composite stack has an overall conductivity of at least $1 \times 10^2$ Siemens/cm. The composite stack is used to render the non-ferroelectric metal oxide-comprising insulator material to be ferroelectric. Conductive material is formed over the composite stack and the insulator material. Ferroelectric capacitors and ferroelectric field effect transistors independent of method of manufacture are also disclosed.

9 Claims, 5 Drawing Sheets

Related U.S. Application Data continuation of application No. 15/840,251, filed on Dec. 13, 2017, now Pat. No. 10,748,914, which is a division of application No. 14/958,182, filed on Dec. 3, 2015, now Pat. No. 9,876,018.

(51) Int. Cl.

| | | |
|---|---|---|
| *H01L 21/28* | (2006.01) | |
| *H10B 51/30* | (2023.01) | |
| *H01L 21/02* | (2006.01) | |
| *H01L 49/02* | (2006.01) | |
| *H01L 29/49* | (2006.01) | |
| *H01L 29/51* | (2006.01) | |
| *H01L 29/66* | (2006.01) | |

(52) U.S. Cl.
CPC ........ *H01L 21/28097* (2013.01); *H01L 28/55* (2013.01); *H01L 28/60* (2013.01); *H01L 29/40111* (2019.08); *H01L 29/4966* (2013.01); *H01L 29/4975* (2013.01); *H01L 29/516* (2013.01); *H01L 29/517* (2013.01); *H01L 29/6684* (2013.01); *H01L 29/78391* (2014.09); *H10B 51/30* (2023.02)

(58) Field of Classification Search
CPC ... H01L 21/28097; H01L 28/40; H01L 28/55; H01L 28/60; H01L 29/516; H01L 29/517; H01L 29/6684; H01L 29/40111; H01L 29/785; H01L 29/78391; H01L 29/4975; H01L 29/4966

See application file for complete search history.

(56) References Cited

U.S. PATENT DOCUMENTS

| | | | |
|---|---|---|---|
| 6,153,898 | A | 11/2000 | Watanbe et al. |
| 6,165,622 | A | 12/2000 | Kijima et al. |
| 6,172,385 | B1 | 1/2001 | Duncombe et al. |
| 6,180,971 | B1 | 1/2001 | Maejima |
| 6,188,098 | B1 | 2/2001 | Amanuma |
| 6,198,119 | B1 | 3/2001 | Nanatame et al. |
| 6,236,076 | B1 | 5/2001 | Arita et al. |
| 6,339,238 | B1 | 1/2002 | Lim et al. |
| 6,495,878 | B1 | 12/2002 | Hayashi et al. |
| 6,509,601 | B1 | 1/2003 | Lee et al. |
| 6,773,930 | B2 | 8/2004 | Summerfelt et al. |
| 6,812,510 | B2 | 11/2004 | Horii et al. |
| 7,015,564 | B2 | 3/2006 | Nagano et al. |
| 7,026,693 | B2 | 4/2006 | Shimizu et al. |
| 7,053,433 | B1 | 5/2006 | Derbenwick |
| 7,148,530 | B2 | 12/2006 | Shin et al. |
| 7,314,842 | B2 | 1/2008 | Li |
| 7,378,329 | B2 | 5/2008 | Nakazawa et al. |
| 7,390,678 | B2 | 6/2008 | Wang et al. |
| 7,709,359 | B2 | 5/2010 | Boescke et al. |
| 7,772,014 | B2 | 8/2010 | Udayakumar et al. |
| 8,093,071 | B2 | 1/2012 | Wang et al. |
| 8,304,823 | B2 | 11/2012 | Boescke |
| 8,796,751 | B2 | 8/2014 | Ramaswamy et al. |
| 9,147,689 | B1 | 9/2015 | Chavan et al. |
| 9,779,797 | B2 | 10/2017 | Ino et al. |
| 2001/0011743 | A1 | 8/2001 | Arita et al. |
| 2002/0125518 | A1 | 9/2002 | Haneder et al. |
| 2003/0179617 | A1 | 9/2003 | Gundesen et al. |
| 2004/0046197 | A1 | 3/2004 | Basceri et al. |
| 2005/0040481 | A1 | 2/2005 | Shimizu et al. |
| 2006/0118841 | A1 | 6/2006 | Eliason et al. |
| 2006/0134808 | A1 | 6/2006 | Summerfelt et al. |
| 2006/0145225 | A1 | 7/2006 | Kohlstedt et al. |
| 2006/0263977 | A1 | 11/2006 | Kim et al. |
| 2008/0001254 | A1 | 1/2008 | Wang |
| 2009/0087623 | A1* | 4/2009 | Brazier ............ H01L 21/28194 427/78 |
| 2009/0261395 | A1 | 10/2009 | Boescke |
| 2014/0141531 | A1 | 5/2014 | Iida et al. |
| 2014/0147940 | A1 | 5/2014 | Visokay et al. |
| 2014/0332750 | A1 | 11/2014 | Ramaswamy et al. |
| 2015/0303206 | A1 | 10/2015 | Chavan et al. |
| 2015/0340372 | A1 | 11/2015 | Pandey et al. |
| 2015/0364535 | A1 | 12/2015 | Triyoso et al. |
| 2016/0207761 | A1 | 7/2016 | Alam et al. |
| 2017/0162587 | A1 | 6/2017 | Chavan et al. |

FOREIGN PATENT DOCUMENTS

| | | |
|---|---|---|
| CN | 201680070615.9 | 9/2020 |
| EP | 0781736 | 7/1997 |
| EP | 16871282.6 | 6/2019 |
| JP | H 9-110592 | 4/1997 |
| JP | H 9-186376 | 7/1997 |
| JP | H 9-245525 | 9/1997 |
| JP | H 10-182292 | 7/1998 |
| JP | 2002-198495 | 7/2002 |
| JP | 2002-543627 | 12/2002 |
| JP | 2004-179617 | 6/2004 |
| JP | 2005-045081 | 2/2005 |
| JP | 2005-101517 | 4/2005 |
| JP | 2008-010772 | 1/2008 |
| JP | 2015-535146 | 12/2015 |
| KR | 10-1998-0065506 | 10/1998 |
| KR | 10-2004-0070564 | 8/2004 |
| KR | 10-2014-0004855 | 1/2014 |
| TW | 105139886 | 7/2017 |
| WO | WO 00/67331 | 11/2000 |
| WO | WO 2015/141625 | 9/2015 |
| WO | WO PCT/US2016/063046 | 3/2017 |
| WO | WO 2017/095678 | 6/2017 |
| WO | WO PCT/US2016/063046 | 6/2018 |

OTHER PUBLICATIONS

Muller et al., "Ferroelectric Hafnium Oxide Based Materials and Devices: Assessment of Current Status and Future Prospects", ECS Journal of Solid State Science and Technology vol. 4, No. 5, 2015, United States, pp. 30-35.

* cited by examiner

US 11,856,790 B2

FERROELECTRIC CAPACITORS

RELATED PATENT DATA

This patent resulted from a divisional of U.S. patent application Ser. No. 16/989,218, filed Aug. 10, 2020, which resulted from a continuation of U.S. patent application Ser. No. 15/840,251, filed Dec. 13, 2017, now U.S. Pat. No. 10,748,914, which resulted from a divisional of U.S. patent application Ser. No. 14/958,182, filed Dec. 3, 2015, now U.S. Pat. No. 9,876,018, entitled "Ferroelectric Capacitor, Ferroelectric Field Effect Transistor, And Method Used In Forming An Electronic Component Comprising Conductive Material And Ferroelectric Material", naming Ashonita A. Chavan, Durai Vishak Nirmal Ramaswamy, and Manuj Nahar as inventors, the disclosures of which are incorporated by reference.

TECHNICAL FIELD

Embodiments disclosed herein pertain to ferroelectric capacitors, to ferroelectric field effect transistors, and to methods used in forming an electronic component comprising conductive material and ferroelectric material.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states and thereby can comprise programmable material of a memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator material. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage regions as part of the gate construction. Transistors other than field effect transistors, for example bipolar transistors, may additionally or alternately be used in memory cells.

One type of transistor is a ferroelectric field effect transistor (FeFET) wherein at least some portion of the gate construction comprises ferroelectric material. Again, such materials are characterized by two stable polarized states. These different states in field effect transistors may be characterized by different threshold voltage ($V_t$) for the transistor or by different channel conductivity for a selected operating voltage. Polarization state of the ferroelectric material can be changed by application of suitable programming voltages, and which results in one of high channel conductance or low channel conductance. The high and low conductance, invoked by the ferroelectric polarization state, remains after removal of the programming gate voltage (at least for a time). The status of the channel conductance can be read by applying a small drain voltage which does not disturb the ferroelectric polarization.

Capacitors and transistors may be used in circuitry other than memory circuitry.

DETAILED DESCRIPTION OF EXAMPLE EMBODIMENTS

Embodiments of the invention encompass a method used in forming an electronic component that comprises conductive material and ferroelectric material. Embodiments of the invention also encompass a ferroelectric capacitor independent of method of manufacture. Embodiments of the invention also encompass a ferroelectric field effect transistor independent of method of manufacture.

Figure 1:
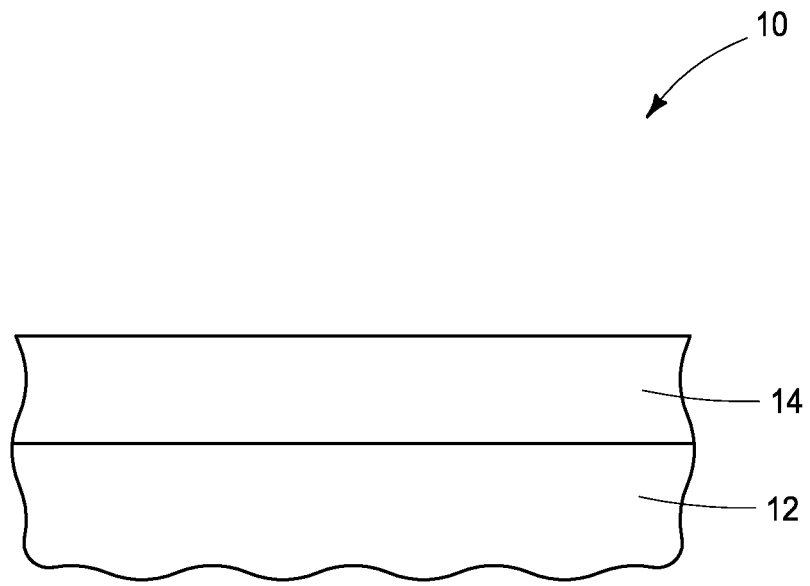
FIG. 1 is a diagrammatic sectional view of a substrate fragment in process in accordance with an embodiment of the invention.

Referring to FIG. 1, method embodiments will be initially described with respect to an example substrate fragment 10 comprising a base substrate 12, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Materials may be aside, elevationally inward, or elevationally outward of the FIG. 1—depicted materials. For example, other partially or wholly fabricated components of integrated circuitry may be provided somewhere about or within fragment 10.

Substrate 12 may comprise any one or more of conductive/conductor (i.e., electrically herein), semiconductive, or insulative/insulator (i.e., electrically herein) materials. In the context of this document, a conductor/conductive material has compositional intrinsic electrical conductivity of at least $3 \times 10^4$ Siemens/cm (i.e., at 20° C. everywhere herein) as opposed to electrical conductivity that could occur by movement of positive or negative charges through a thin material that is otherwise intrinsically insulative. An insulator/insulative material has compositional intrinsic electrical conductivity of no greater than $1 \times 10^{-9}$ Siemens/cm (i.e., it is electrically resistive as opposed to being conductive or semiconductive). Any of the materials, regions, and structures described herein may be homogenous or non-homogenous, and regardless may be continuous or discontinuous over any material which such overlie. Further, unless otherwise stated, each material may be formed using any suitable or yet-to-be developed technique, with atomic layer deposition, chemical vapor deposition, physical vapor deposition, epitaxial growth, diffusion doping, and ion implanting being examples.

A non-ferroelectric metal oxide-comprising insulator material 14 has been formed over substrate 12. Any suitable existing or yet-to-be-developed non-ferroelectric metal oxide-comprising insulator material may be used. In one embodiment, the non-ferroelectric insulator material comprises one or more of transition metal oxide, zirconium, zirconium oxide, hafnium, hafnium oxide, lead zirconium titanate, tantalum oxide, strontium oxide, strontium titanium oxide, titanium oxide, and barium strontium titanate, and which may have dopant therein which comprises one or more of silicon, aluminum, lanthanum, yttrium, erbium, calcium, magnesium, strontium, lutetium, dysprosium, gadolinium, praseodymium, chromium, niobium, tantalum, hafnium, zirconium, vanadium manganese, cobalt, nickel, carbon and any other rare earth element. One particular example includes a hafnium and zirconium based oxide having suitable dopant therein. Other examples include a hafnium and silicon based oxide having suitable dopant therein; a yttrium and zirconium based oxide having suitable dopant therein; and a hafnium, silicon, and zirconium based oxide. Insulator material 14 may be deposited in any phase (e.g., amorphous or crystalline) and which phase may remain or change during subsequent processing. By way of examples, any of the non-ferroelectric metal oxide-comprising insulator materials described in U.S. Pat. No. 7,709,359 to Boeske et al. and/or U.S. Pat. No. 8,304,823 to Boeske may be used, and such references are herein incorporated by reference.

An example thickness for insulator material 14 is from about 10 Angstroms to about 200 Angstroms, and in one embodiment from about 30 Angstroms to about 90 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thickness. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physically touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Figure 2:
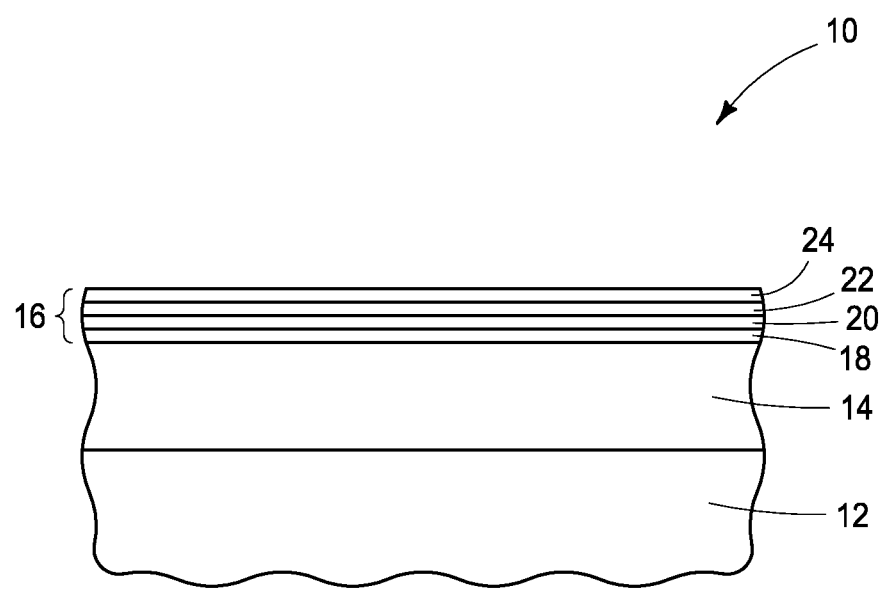
FIG. 2 is a view of the FIG. 1 substrate at a processing step subsequent to that shown by FIG. 1.

Referring to FIG. 2, a composite stack 16 comprising at least two different composition non-ferroelectric metal oxides has been formed over substrate 12, and in one embodiment as shown over metal oxide-comprising insulator material 14. In the context of this document, "composite stack" means a construction comprising multiple layers wherein individual of at least two different composition non-ferroelectric metal oxides are in different layers and without precluding intermixing of at least some immediately adjacent of the layers. Use of "layer" and "layers" does not require blanketing or complete coverage of such over underlying material, and such may be discontinuous or only partially received over underlying material. Regardless, the composite stack has an overall conductivity of at least $1 \times 10^2$ Siemens/cm. In one embodiment, the composite stack has an overall conductivity no greater than $1 \times 10^3$ Siemens/cm. An example overall thickness for composite stack 16 is from about 5 Angstroms to about 50 Angstroms, and in one embodiment from about 10 Angstroms to about 20 Angstroms.

In one ideal embodiment and as shown, composite stack 16 and metal oxide-comprising insulator material 14 are formed directly against one another. In one embodiment, each of the at least two different composition non-ferroelectric metal oxides has conductivity of at least $1 \times 10^2$ Siemens/cm. In one embodiment, at least one of the at least two different composition non-ferroelectric metal oxides does not have conductivity of at least $1 \times 10^2$ Siemens/cm (i.e., composition and volume of the other non-ferroelectric metal oxide material(s) being sufficient such that the overall composite stack has conductivity of at least $1 \times 10^2$ Siemens/cm). In one embodiment, the at least two different composition non-ferroelectric metal oxides are selected from among $TiO_x$, $AlO_x$, $Al_2O_3$, $SeO_x$, $Sc_2O_3$, $ZrO_x$, $YO_x$, $Y_2O_3$, $MgO_x$, $MgO$, $HfO_x$, $SrO_x$, $SrO$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$, with "x" as used in empirical formulas herein for oxides being any suitable number such that at least some of the material comprises molecular oxide, although which may not necessarily be overall stoichiometric throughout the material or even a majority of such material be stoichiometric. Desired conductivity/resistivity can be achieved depending upon quantity of metal atoms and oxygen atoms in the composition(s).

FIG. 2 depicts composite stack 16 as comprising four layers 18, 20, 22, and 24, with each by way of example only being shown as being of the same constant thickness. Fewer layers may be used (i.e., at least two layers of different compositions) or more than four layers may be used, and independent of whether of the same respective thicknesses, of different respective thicknesses, of the same or different variable thicknesses, etc. In one embodiment, the composite stack is formed to comprise only two different composition non-ferroelectric metal oxides (e.g., only two different composition non-ferroelectric metal oxides are selected from among $TiO_x$, $AlO_x$, $Al_2O_3$, $SeO_x$, $Sc_2O_3$, $ZrO_x$, $YO_x$, $Y_2O_3$, $MgO_x$, $MgO$, $HfO_x$, $SrO_x$, $SrO$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$, per the above). In one embodiment, the composite stack is formed to comprise two alternating layers, and in one embodiment only two alternating layers, of each of the two different composition non-ferroelectric metal oxides (e.g., A/B/A/B, where A and B are only two different ones of $TiO_x$, $AlO_x$, $Al_2O_3$, $ScO_x$, $Sc_2O_3$, $ZrO_x$, $YO_x$, $Y_2O_3$, $MgO_x$, $MgO$, $HfO_x$, $SrO_x$, $SrO$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$). In one embodiment, the composite stack is formed to consist essentially of the at least two different composition non-ferroelectric metal oxides. However in another embodiment, the composite stack is formed to comprise additional material, for example additionally comprising $SiO_x$ (e.g., within and/or as an elevationally outermost or innermost layer of the composite stack).

Figure 3:
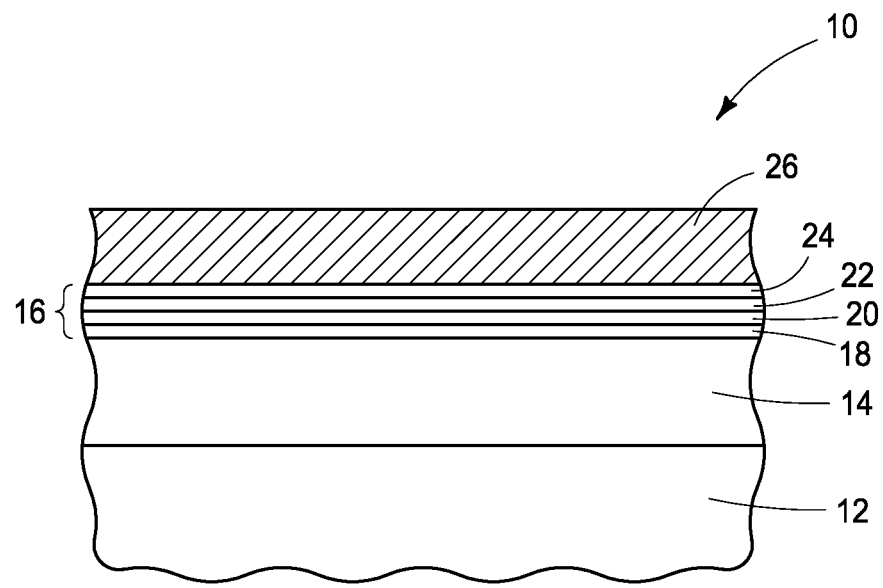
FIG. 3 is a view of the FIG. 2 substrate at a processing step subsequent to that shown by FIG. 2.

Referring to FIG. 3, conductive material 26 has been formed over composite stack 16 and insulator material 14, and in one embodiment as shown directly against composite stack 16. In one embodiment, composite stack 16 is of lower conductivity than conductive material 26. An example thickness for conductive material 26 is 50 Angstroms. Any suitable conductive material(s) may be used, with elemental metal, an alloy of two or more elemental metals, conductive metal compounds, and conductively doped semiconductive material being examples.

In accordance with the method embodiments, composite stack 16 is used to render non-ferroelectric metal oxide comprising insulator material 14 to be ferroelectric. Composite stack 16 remains non-ferroelectric in the finished circuitry construction. Material 14 is insulative both before and after transformation from being non-ferroelectric to being ferroelectric. A composite stack comprising at least two different composition non-ferroelectric metal oxides enables rendering of non-ferroelectric metal oxide-comprising insulator material 14 to be ferroelectric. In one embodiment, metal oxide-comprising insulator material 14 is rendered ferroelectric before forming any of conductive material 26. Alternately, metal oxide-comprising insulator material 14 is rendered ferroelectric after forming some or all of conductive material 26.

In one embodiment, composite stack 16 is used to render non-ferroelectric metal oxide-comprising insulator material 14 to be ferroelectric during a depositing of composite stack 16 over insulator material 14. As but one example in a chemical vapor deposition method in depositing composite stack 16 to be alternating layers of $TiO_x$ and $ZrO_x$, pentamethyl cyclopentadienyl titanium trimethoxide, tris(dimethylamino) cyclopentadienyl zirconium, and ozone may be used as precursors for titanium, zirconium, and oxygen, respectively. Example respective flow rates are 100 to 2,000 sccm, 100 to 2,000 sccm, and 1,000 to 20,000 sccm. Example temperature and pressure ranges are 200° C. to 350° C. and 0.1 Torr to 5 Torr. Plasma (whether direct or remote) may or may not be used. Such example deposition conditions will be sufficient to render non-ferroelectric material 14 to be ferroelectric during deposition of composite stack 16. Alternate conditions (some including different precursors) may be determined and selected by the artisan.

In one embodiment, composite stack 16 is used to render non-ferroelectric metal oxide-comprising insulator material 14 to be ferroelectric after a depositing of composite stack 16 over insulator material 14. Example such conditions include annealing in a furnace using an inert atmosphere with an ambient or substrate temperature of at least 350° C., pressure from 0.1 Torr to 7,600 Torr, for at least 5 seconds. Composite stack 16 may be used to render non-ferroelectric metal oxide-comprising insulator material 14 to be ferroelectric partially during and partially after deposition of composite stack 16.

Figure 4:
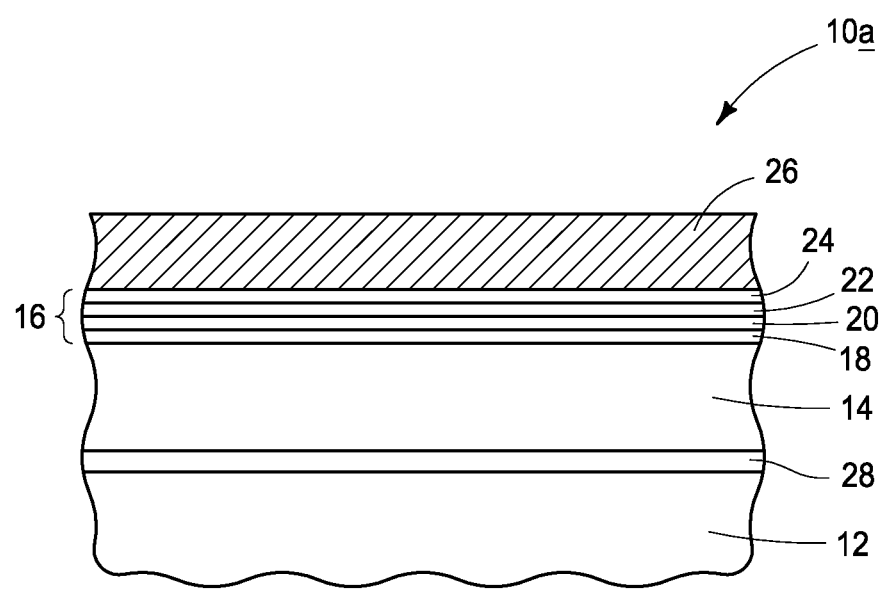
FIG. 4 is a diagrammatic sectional view of a substrate fragment in process in accordance with an embodiment of the invention.

Alternate embodiment methods used in forming an electronic component to those described and shown above with respect to FIGS. 1-3 are next described with reference to FIG. 4 and a substrate fragment 10a. Like numerals from the above-described embodiments have been used where appropriate, with some construction differences being indicated with the suffix "a" or with different numerals. Substrate fragment 10a comprises a non-ferroelectric metal oxide comprising insulative material 28 that is non-ferroelectric in a finished circuitry construction comprising the electronic component. Accordingly, the processing described above with respect to FIG. 1 will be somewhat different in that non-ferroelectric metal oxide-comprising insulator material 14 is formed over, and in one embodiment directly against, insulative material 28. Example non ferroelectric insulative materials 28 include any insulative non-ferroelectric metal oxide(s) in the fifth paragraph in this document that precedes the paragraph containing this sentence. An example thickness range for insulative material 28 is from about 1 Angstrom to about 10 Angstroms, and in one embodiment from about 2 Angstroms to about 5 Angstroms. Insulative material 28 may facilitate or be used to invoke a desired crystalline structure in non ferroelectric metal oxide-comprising insulator material 14 as initially-formed and/or in the ferroelectric-rendered metal oxide comprising insulator material 14 (i.e., upon its becoming ferroelectric). Any other attribute(s) or aspect(s) as described above and/or shown in FIGS. 1-3 may be used in the FIG. 4 embodiments.

Figure 5:
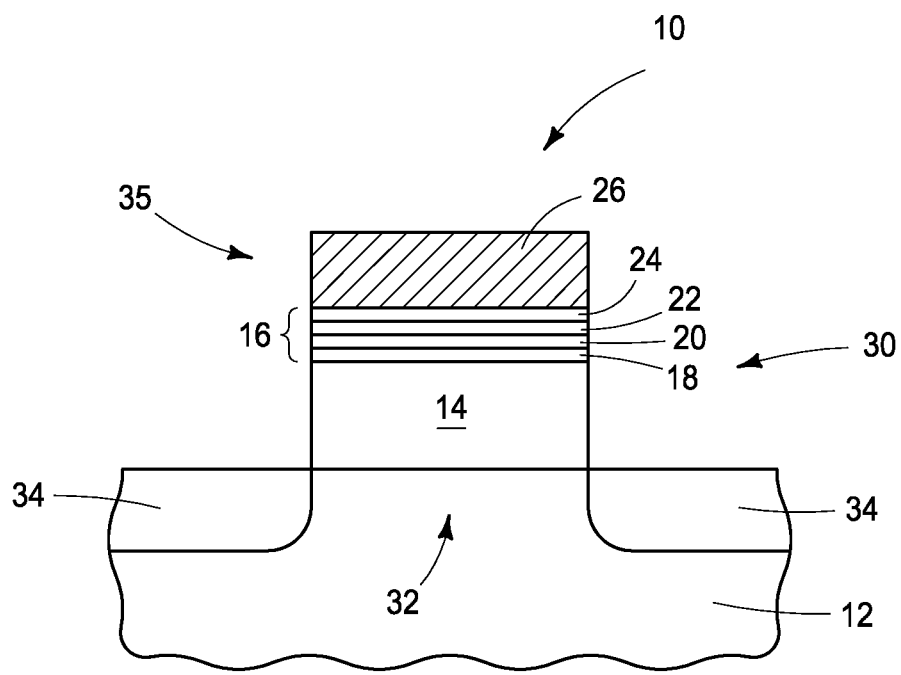
FIG. 5 is a diagrammatic sectional view of a substrate fragment in process in accordance with an embodiment of the invention, and of a substrate fragment in accordance with an embodiment of the invention.

Subsequent processing as described below may be conducted with respect to substrate fragment 10/10a. For example, FIG. 5 shows patterning having been conducted of insulator material 14, composite stack 16, and conductive material 26 to form a ferroelectric gate construction 30 of a ferroelectric field effect transistor 35, with ferroelectric material 14 functioning as the gate insulator. Base substrate 12 may comprise suitably doped semiconductive material to provide a semiconductive channel 32 operatively proximate gate construction 30 and a pair of source/drain regions 34 on opposite side thereof. The rendering of non-ferroelectric material 14 to be ferroelectric may occur before or after the patterning depicted by FIG. 5. Further and regardless, although a simple planar and horizontal ferroelectric field effect transistor 35 is shown, vertical, recessed, non-linear channel constructions, etc. may be formed, and whether existing or yet-to-be-developed. In this document, "horizontal" refers to a general direction along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", "bottom", and "beneath" are with reference to the vertical direction relative to a base substrate upon which the circuitry is fabricated.

The above described processing formed insulator material 14 before forming composite stack 16. Alternately, composite stack 16 may be formed before forming insulator material 14. In one such embodiment, a composite stack comprising at least two different composition non-ferroelectric metal oxides is formed over a substrate. The composite stack has an overall conductivity of at least $1 \times 10^2$ Siemens/cm. A metal oxide-comprising insulator material is formed over the composite stack and in one embodiment to be ferroelectric upon its initial formation by using the composite stack to render ferroelectric what would otherwise be a non-ferroelectric metal oxide-comprising insulator material formed under identical conditions (e.g., all conditions of same processor make-model, precursors, flow rates, temperatures, pressures, time, etc.) without (i.e., but for) presence of the composite stack. As but one example of forming such a ferroelectric metal oxide-comprising insulator material, chemical vapor deposition may be conducted using any suitable precursors, and temperature and pressure ranges of 200° C. to 350° C. and 0.1 Torr to 5 Torr, and with or without plasma. Conductive material is formed over the composite stack and the insulator material. Any other attribute(s) or aspect(s) as shown and/or described above may be used.

Figure 6:
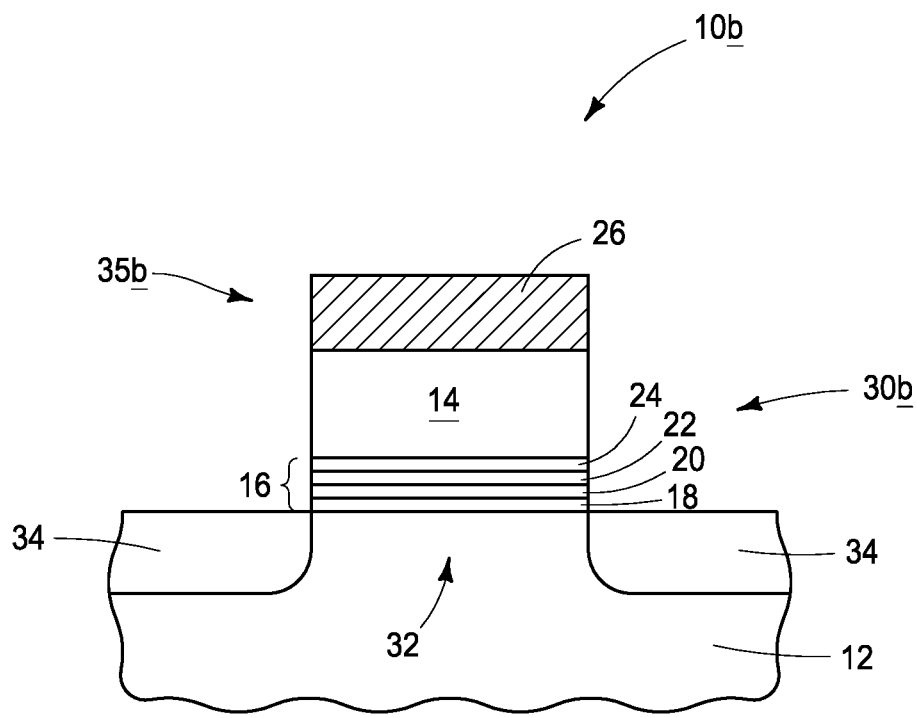
FIG. 6 is a diagrammatic sectional view of a substrate fragment in process in accordance with an embodiment of the invention, and of a substrate fragment in accordance with an embodiment of the invention.

FIG. 6 shows an example alternate ferroelectric gate construction 30b of a ferroelectric field effect transistor 35b. Like numerals from the above-described embodiments have been used where appropriate, with some construction differences being indicated with the suffix "b". Composite stack 16 is shown formed over, and in one embodiment directly against, channel 32, and before the forming of insulator material 14. Conductive material 26 is formed over, and in one embodiment directly against, insulator material 14. Any other attribute(s) or aspect(s) as shown and/or described above may be used.

Figure 7:
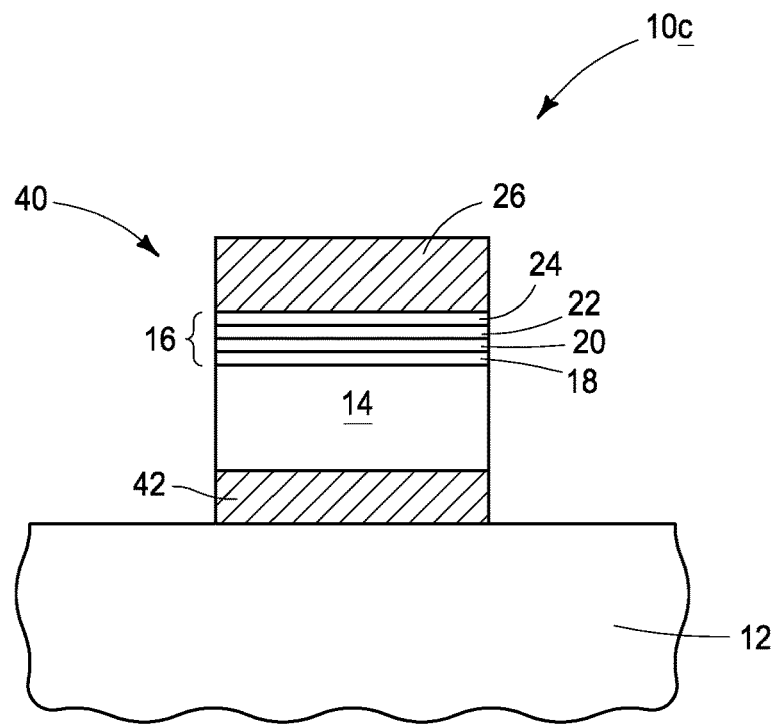
FIG. 7 is a diagrammatic sectional view of a substrate fragment in process in accordance with an embodiment of the invention, and of a substrate fragment in accordance with an embodiment of the invention.

An alternate example construction that may be fabricated with method embodiments of the invention is shown in FIG. 7 with respect to a substrate fragment 10c. Like numerals from the above-described embodiments have been used where appropriate, with some construction differences being indicated with the suffix "c" or with different numerals. Substrate 10c comprises a ferroelectric capacitor 40. Such may be fabricated by forming conductor material 42 over base substrate 12 of FIG. 1 prior to forming non-ferroelectric metal oxide-comprising insulator material 14 there-over. Conductor material 42 may comprise any of the materials described above for conductive material 26, and conductor material 42 and conductive material 26 may be of the same composition or of different compositions (and same or different thicknesses) relative one another. Processing may otherwise occur in any of the manners described above. Conductive material 26, composite stack 16, insulator material 14, and conductor material 42 are shown as then having been patterned into ferroelectric capacitor construction 40. Composite stack 16 may be used to render insulator material 14 ferroelectric before, after, during, or both of the example patterning shown by FIG. 7.

Figure 8:
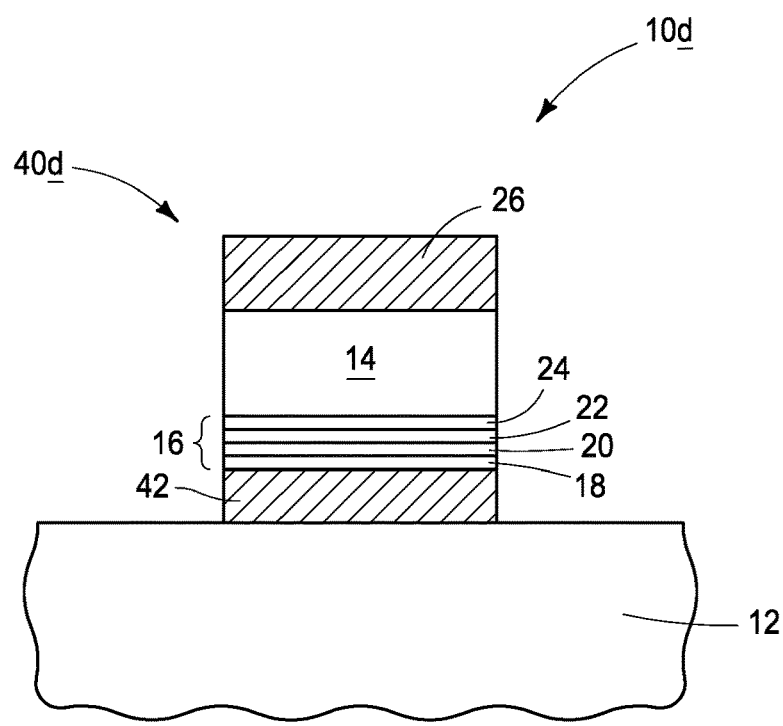
FIG. 8 is a diagrammatic sectional view of a substrate fragment in process in accordance with an embodiment of the invention, and of a substrate fragment in accordance with an embodiment of the invention.

FIG. 8 shows an alternate embodiment ferroelectric capacitor 40d manufactured in accordance with the above example method embodiments whereby composite stack 16 has been formed before forming insulator material 14. Like numerals from the above-described embodiments have been used where appropriate, with some construction differences being indicated with the suffix "d". Any other attribute(s) or aspect(s) as shown and/or described above may be used.

Figure 9:
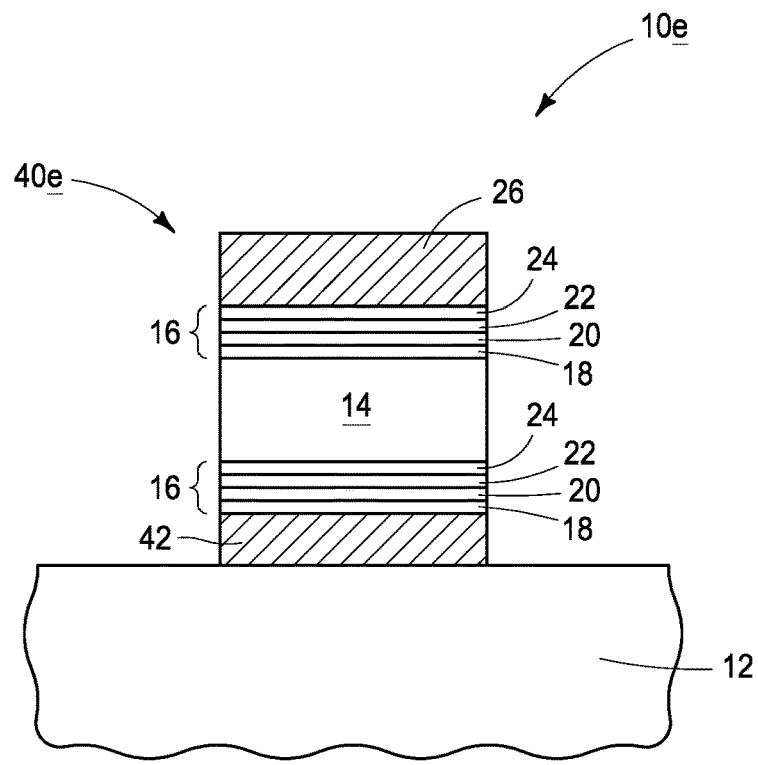
FIG. 9 is a diagrammatic sectional view of a substrate fragment in process in accordance with an embodiment of the invention, and of a substrate fragment in accordance with an embodiment of the invention.

The above described embodiments form a single composite stack region 16. FIG. 9 shows an alternate example ferroelectric capacitor construction 40e comprising two composite stacks 16. Like numerals from the above-described embodiments have been used where appropriate, with some construction differences being indicated with the suffix "e". Composite stacks 16 need not be of the same construction and/or compositions relative one another, and may ideally be of different construction and/or compositions relative one another. Any other attribute(s) or aspect(s) as shown and/or described above may be used.

Figure 10:
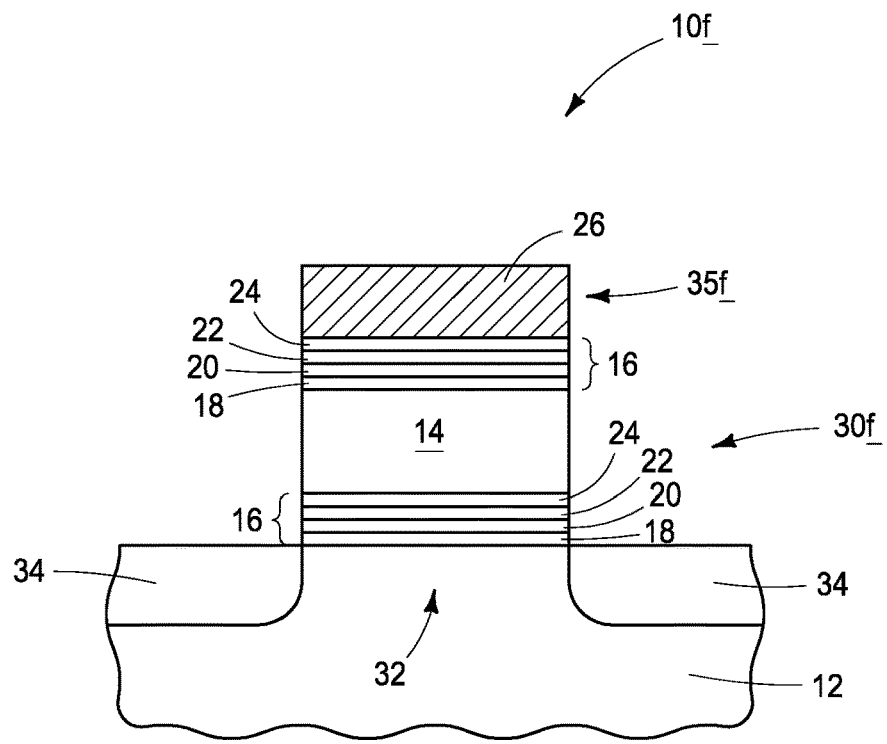
FIG. 10 is a diagrammatic sectional view of a substrate fragment in process in accordance with an embodiment of the invention, and of a substrate fragment in accordance with an embodiment of the invention.

As shown in FIG. 10, a ferroelectric field effect transistor 30f having a gate construction 35f with more than one composite stack region 16 may also be fabricated. Like numerals from the above-described embodiments have been used where appropriate, with some construction differences being indicated with the suffix "f" in FIG. 10. Any other attribute(s) or aspect(s) as shown and/or described above may be used.

An embodiment of the invention includes a ferroelectric capacitor independent of method of manufacture, yet for example ferroelectric capacitors 40, 40d, and 40e as shown in FIGS. 7-9. Such a ferroelectric capacitor in accordance with device embodiments of the invention comprises two conductive capacitor electrodes (e.g., materials 26 and 42) having ferroelectric material there-between (e.g., ferroelectric insulator material 14, and regardless of whether such comprises oxide material). Non-ferroelectric material is between at least one of the conductive capacitor electrodes and the ferroelectric material. The non-ferroelectric material comprises a composite stack (e.g., composite stack 16) of at least two different composition non-ferroelectric metal oxides. The non-ferroelectric material has an overall conductivity of at least $1\times10^2$ Siemens/cm and is of lower conductivity than the conductive capacitor electrode which the non-ferroelectric material is more proximate (e.g., electrode 26 in FIG. 7 and electrode 42 in FIG. 8). The ferroelectric material may be between only one of the conductive capacitor electrodes and the ferroelectric material (e.g., FIG. 7 or 8), or may be between each of the conductive capacitor electrodes and the ferroelectric material (e.g., FIG. 9). Any other attribute as described above in the method embodiments may be used or apply in a ferroelectric capacitor device construction in accordance with the invention independent of method of manufacture.

An embodiment of the invention comprises a ferroelectric field effect transistor independent of method of manufacture. Such a transistor comprises a pair of source/drain regions (e.g., regions 34) having a semiconductive channel therebetween (e.g., channel 32). Such a ferroelectric field effect transistor also comprises a gate construction (e.g., construction 30/30b/30f) comprising ferroelectric gate insulator material (e.g., material 14, and independent of whether comprising oxide material) and a conductive gate electrode (e.g., material 26). The ferroelectric field effect transistor also comprises non-ferroelectric material between at least one of a) the ferroelectric gate insulator material and the conductive gate electrode, and b) the ferroelectric gate insulator material and the channel. The non-ferroelectric material comprises a composite stack (e.g., composite stack 16) of at least two different composition non-ferroelectric metal oxides. The non-ferroelectric material has an overall conductivity of at least $1\times10^2$ Siemens/cm and is of lower conductivity than the gate electrode. FIGS. 5, 6, and 10 depict but three such example embodiments, and any other attribute as described above with respect to the method embodiments may be employed in a ferroelectric field effect transistor device construction in accordance with the invention independent of method of manufacture.

A predecessor process of forming a construction that did not include composite stack 16 required the composition of conductive material 26 to be TiN for a non-ferroelectric metal oxide-comprising insulator material 14 as-deposited to be subsequently rendered ferroelectric, and accordingly during and/or after forming the TiN. TiN may not be desirable in all finished circuitry constructions, and provision of composite stack 16 enables use of compositions for conductive material 26 other than TiN (e.g., conductive metal oxides such as $IrO_x$, $SrRuO_3$, $RuO_x$, and LSCO; silicides such as $TiSi_x$, $TaSi_x$, and $RuSi_x$; $WN_xSi_y$; Ru; and other conductive metal nitrides such as TiAlN, TaN, $WN_x$, $TiSi_xN_y$, $TaSi_xN_y$, $RuSi_xN_y$, and $RuSi_xTi_yN_z$). Using conductive materials other than TiN may reduce required overall thermal processing of the substrate. Further, using conductive electrode materials other than TiN may improve performance of the ferroelectric material in the overall electronic component. However, in one embodiment conductive material 26 comprises TiN and in another embodiment is devoid of TiN. Providing only a single composition of a non-ferroelectric metal oxide material between conductive material 26 and insulator material 14, which is outside of the scope of this invention, is lacking as requiring a dedicated post-deposition anneal and/or producing a lower degree of conversion to a desired crystalline phase whether initially amorphous or initially of an undesired crystalline phase.

Use of a composite stack as described herein may improve duty cycle performance. For example, consider a ferroelectric capacitor comprising TiN top and bottom electrodes having a 65 Angstroms ferroelectric capacitor insulator there-between manufactured in accordance with a predecessor technique (i.e., a single homogenous insulator composition between the electrodes in the absence of a composite stack as described herein). Consider a construction manufactured in accordance with the invention comprising the same 65 Angstroms ferroelectric capacitor insulator and additionally having a composite stack comprising four alternating layers of a material A and a material B (total thickness of about 15 Angstroms) between the top TiN capacitor electrode and the 65 Angstroms ferroelectric capacitor insulator, where materials A and B are only two different ones of $TiO_x$, $AlO_x$, $ScO_x$, $ZrO_x$, $YO_x$, $MgO_x$, $HfO_x$, $SrO_x$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$. Such a construction manufactured in accordance with the invention displayed improved duty cycle performance.

CONCLUSION

In some embodiments, a method used in forming an electronic component comprising conductive material and ferroelectric material comprises forming a non-ferroelectric metal oxide-comprising insulator material over a substrate. A composite stack comprising at least two different composition non-ferroelectric metal oxides is formed over the substrate. The composite stack has an overall conductivity of at least $1\times10^2$ Siemens/cm. The composite stack is used to render the non-ferroelectric metal oxide-comprising insulator material to be ferroelectric. Conductive material is formed over the composite stack and the insulator material.

In some embodiments, a method used in forming an electronic component comprising conductive material and ferroelectric material comprises forming a composite stack comprising at least two different composition non-ferroelectric metal oxides over a substrate. The composite stack has an overall conductivity of at least $1\times10^2$ Siemens/cm. Metal oxide-comprising insulator material is formed over the composite stack and to be ferroelectric upon its initial formation by using the composite stack to render ferroelectric what would otherwise be a non-ferroelectric metal oxide-comprising insulator material formed under identical conditions without presence of the composite stack. Conductive material is formed over the composite stack and the insulator material.

In some embodiments, a ferroelectric capacitor comprises two conductive capacitor electrodes having ferroelectric material there-between. Non-ferroelectric material is between at least one of the conductive capacitor electrodes and the ferroelectric material. The non-ferroelectric material comprises a composite stack comprising at least two different composition non-ferroelectric metal oxides. The non-ferroelectric material has an overall conductivity of at least $1\times10^2$ Siemens/cm and is of lower conductivity than the conductive capacitor electrode which the non-ferroelectric material is more proximate.

In some embodiments, a ferroelectric field effect transistor comprises a pair of source/drain regions having a semiconductive channel there-between. Also, a gate construction thereof comprises ferroelectric gate insulator material and a conductive gate electrode. The gate constructions also includes non-ferroelectric material between at least one of a) the ferroelectric gate insulator material and the conductive gate electrode, and b) the ferroelectric gate insulator material and the channel. The non-ferroelectric material comprises a composite stack comprising at least two different composition non-ferroelectric metal oxides. The non-ferroelectric material has an overall conductivity of at least $1\times10^2$ Siemens/cm and is of lower conductivity than the gate electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A ferroelectric field effect transistor, comprising:
   a pair of source/drain regions having a semiconductive channel therebetween; and
   a gate structure comprising:
   a ferroelectric gate insulator material comprising one or more members of the group consisting of zirconium, zirconium oxide, hafnium, hafnium oxide, lead zirconium titanate, tantalum oxide, strontium oxide, and strontium titanium oxide;
   a conductive gate electrode; and
   a composite stack comprising at least two non-ferroelectric metal oxide compositions, the composite stack having three or more discrete layers including a first layer, a second layer and a third layer with the second layer being in direct physical contact with the first and third layers and with at least one of the layers comprised by the composite stack containing a metal oxide selected from the group consisting of ScOx, $Sc_2O_3$, YOx, $Y_2O_3$, MgOx, MgO, SrOx, SrO, NbOx, GdOx, MoOx, RuOx, LaOx, VxOy, IrOx, CrOx, ZnOx, PrOx, CeOx, SmOx, and LuOx, the composite stack having an overall conductivity that is less than a conductivity of the conductive gate electrode.

2. The ferroelectric field effect transistor of claim 1, wherein the ferroelectric gate insulator material is directly against the composite stack.

3. The ferroelectric field effect transistor of claim 1, wherein the composite stack further includes at least one additional non-ferroelectric metal oxide composition selected from the group consisting of TiOx, AlOx, ZrOx, MgOx, HfOx, and NbOx.

4. The ferroelectric field effect transistor of claim 3, wherein the at least one additional non-ferroelectric metal oxide composition is TiOx.

5. The ferroelectric field effect transistor of claim 3, wherein the at least one additional non-ferroelectric metal oxide composition is AlOx.

6. The ferroelectric field effect transistor of claim 3, wherein the at least one additional non-ferroelectric metal oxide composition is NbOx.

7. The ferroelectric field effect transistor of claim 3, wherein the at least one additional non-ferroelectric metal oxide composition is ZrOx.

8. The ferroelectric field effect transistor of claim 3, wherein the at least one additional non-ferroelectric metal oxide composition is MgOx.

9. The ferroelectric field effect transistor of claim 3, wherein the at least one additional non-ferroelectric metal oxide composition is HfOx.

* * * * *